(12) United States Patent
Williams et al.

(10) Patent No.: US 12,029,006 B2
(45) Date of Patent: Jul. 2, 2024

(54) SYSTEM AND METHOD FOR REPURPOSING WASTE HEAT IN COMPUTING DEVICES

(71) Applicant: Dell Products L.P., Round Rock, TX (US)

(72) Inventors: Steven L. Williams, Round Rock, TX (US); David William Grunow, Round Rock, TX (US); Qinghogn He, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 241 days.

(21) Appl. No.: 17/871,692

(22) Filed: Jul. 22, 2022

(65) Prior Publication Data
US 2024/0032239 A1  Jan. 25, 2024

(51) Int. Cl.
  H05K 7/20 (2006.01)
  G06F 1/20 (2006.01)

(52) U.S. Cl.
  CPC ......... H05K 7/20209 (2013.01); G06F 1/206 (2013.01); H05K 7/20145 (2013.01)

(58) Field of Classification Search
  CPC combination set(s) only.
  See application file for complete search history.

(56) References Cited

U.S. PATENT DOCUMENTS

| | | | | |
|---|---|---|---|---|
| 5,694,294 A * | 12/1997 | Ohashi | ..... | G06F 1/203 361/679.48 |
| 6,327,144 B1 * | 12/2001 | May | ..... | H01H 13/86 174/15.2 |
| 6,646,226 B1 * | 11/2003 | Reitz | ..... | G06F 3/0202 219/209 |
| 6,878,902 B2 * | 4/2005 | Lyle | ..... | G06F 1/1656 361/679.55 |
| 6,909,602 B2 * | 6/2005 | Dietrich | ..... | G06F 1/203 361/679.48 |
| 7,327,559 B2 * | 2/2008 | Fox | ..... | G06F 1/1616 219/209 |
| 8,419,221 B2 * | 4/2013 | Chen | ..... | G06F 3/0202 219/209 |
| 8,964,383 B2 * | 2/2015 | Degner | ..... | G06F 1/203 361/679.48 |
| 9,282,656 B2 * | 3/2016 | Degner | ..... | B23P 15/26 |
| 9,575,524 B1 * | 2/2017 | Prather | ..... | G06F 1/1662 |
| 9,907,201 B2 * | 2/2018 | Degner | ..... | G06F 1/203 |
| 10,356,942 B2 * | 7/2019 | Degner | ..... | G06F 1/203 |

(Continued)

*Primary Examiner* — Lisa Lea-Edmonds
(74) *Attorney, Agent, or Firm* — Womble Bond Dickinson (US) LLP

(57) ABSTRACT

Methods and systems for thermally managing data processing systems are disclosed. Data processing systems may provide computer implemented services to users thereof and/or other devices. The data processing systems may include various hardware components that perform computations used to provide the computer implemented services and may generate heat as a byproduct. To dissipate the heat generated by the hardware components, airflows proximate to the hardware components may be used to extract the heat. Once extracted, the heated airflows may be exhausted from the data processing systems. To facilitate use of the exhausted airflows, the airflows may be selectively directed in accordance with user preferences.

20 Claims, 10 Drawing Sheets

(56) References Cited

U.S. PATENT DOCUMENTS

| | | | | |
|---|---|---|---|---|
| 10,747,277 B2* | 8/2020 | Ku | ............... | H05K 7/20145 |
| 10,948,953 B2* | 3/2021 | Degner | ............. | H05K 7/20145 |
| 11,150,708 B2* | 10/2021 | Drewery | ............ | H05K 7/20145 |
| 11,262,820 B1* | 3/2022 | North | ................ | G06F 1/3296 |
| 11,262,821 B1* | 3/2022 | North | ................ | G06F 1/3296 |
| 11,262,822 B1* | 3/2022 | North | ................ | H05K 7/20409 |
| 11,314,297 B1* | 4/2022 | Degner | .................. | G06F 1/206 |
| 11,320,876 B1* | 5/2022 | North | ................ | G06F 1/166 |
| 11,733,742 B2* | 8/2023 | North | ................ | G06F 1/1688 |
| | | | | 361/679.02 |
| 11,892,886 B2* | 2/2024 | Degner | ................ | G06F 1/1681 |
| 2003/0218862 A1* | 11/2003 | Dietrich | ............... | G06F 1/1656 |
| | | | | 361/679.08 |
| 2005/0023265 A1* | 2/2005 | Lyle | ..................... | G06F 1/1616 |
| | | | | 219/209 |
| 2006/0256519 A1* | 11/2006 | Fox | ..................... | G06F 3/0202 |
| | | | | 361/679.48 |
| 2013/0327507 A1* | 12/2013 | Degner | ............... | H05K 7/2039 |
| | | | | 361/695 |
| 2015/0163960 A1* | 6/2015 | Degner | .................. | G06F 1/203 |
| | | | | 361/679.5 |
| 2016/0357231 A1* | 12/2016 | Degner | ............. | H05K 7/20336 |
| 2017/0060201 A1* | 3/2017 | Prather | ................ | G06F 1/1662 |
| 2018/0184545 A1* | 6/2018 | Degner | ................ | H05K 7/20145 |
| 2021/0157375 A1* | 5/2021 | Drewery | ............ | H05K 7/20209 |
| 2022/0179461 A1* | 6/2022 | North | .................. | G06F 1/1688 |
| 2022/0236778 A1* | 7/2022 | Degner | .................. | G06F 1/203 |
| 2023/0280804 A1* | 9/2023 | Chung | ..................... | G06F 1/20 |
| | | | | 361/679.27 |
| 2023/0380100 A1* | 11/2023 | Kim | ........................ | G06F 1/206 |
| 2024/0032239 A1* | 1/2024 | Williams | ............... | G06F 1/203 |

* cited by examiner

SYSTEM AND METHOD FOR REPURPOSING WASTE HEAT IN COMPUTING DEVICES

FIELD OF THE EMBODIMENTS

Embodiments disclosed herein relate generally to system management. More particularly, embodiments disclosed herein relate to systems and methods for thermal management of hardware components.

BACKGROUND

Computing devices may provide various types of computer implemented services. For example, the computer implemented services may be database services. To provide the database services hardware components of the computing devices may perform computations. The hardware components may consume electrical power to perform the computations and may generate heat as a byproduct of the computations.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1A:
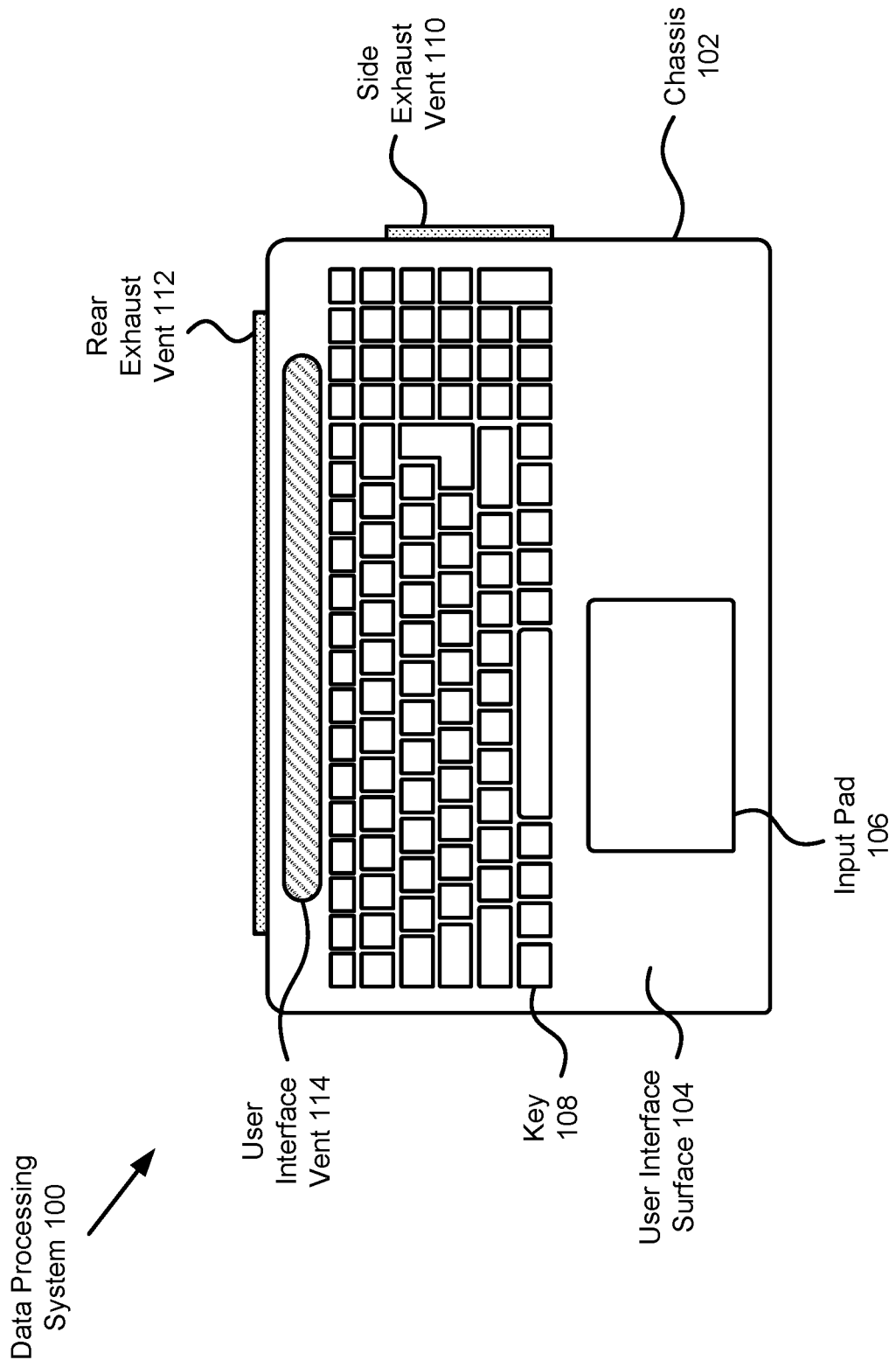
FIG. 1A shows a top view diagram illustrating a data processing system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

In general, embodiments disclosed herein relate to methods and systems for thermally managing data processing systems. Generally, data processing systems may provide computer implemented services to users thereof and/or other devices. The data processing systems may include various hardware components that perform computations used to provide the computer implemented services and may generate heat as a byproduct.

To dissipate the heat generated by the hardware components, airflows proximate to the hardware components may be used to extract the heat. Once extracted, the heated airflows may be exhausted from the data processing systems.

To facilitate use of the exhausted airflows, embodiments disclosed herein may provide data processing systems capable of selectively directing exhausted airflows towards interface components (e.g., keyboards, trackpads, etc.) used by user of the data processing systems. The exhausted airflows proximate to the interface components may be used to warm the user while the user uses the data processing system.

To selectively exhaust the airflows, the data processing system may include one or more mechanisms for redirecting exhausted airflows. By redirecting exhausted airflows, the exhausted airflows may be directed in varying directions in accordance with preferences of the user. For example, the user may provide input used by the data processing system to select in which directions exhaust airflows are directed.

In an embodiment, a data processing system for providing computer implemented services to a user is provided. The data processing system may include a chassis comprising:

an interface surface, a first exhaust vent adapted to direct a first heated exhaust airflow away from the interface surface, and a second exhaust vent adapted to direct a second heated exhaust airflow proximate to the interface surface; and a user interface element positioned on the interface surface to initiate heat transfer between the second heated exhaust airflow and a hand of the user while the user uses the user interface element; a ventilation control component adapted to: receive user input; and modify a rate of the first heated exhaust airflow and a rate of the second heated exhaust airflow based on the user input.

The data processing system may also include a hardware component positioned within the chassis and adapted to: heat the first heated exhaust airflow and the second heated exhaust airflow, and perform a computation used to provide a portion of computer implemented services.

The data processing system may also include fan unit positioned in the chassis and adapted to generate two airflows using an intake airflow from an underside of the chassis, and a first of the two airflows being directed toward the hardware component.

The chassis further may also include a third exhaust vent adapted to direct a third heated exhaust airflow away from the interface surface. The third heated exhaust airflow is generated by passing a second of the two airflows to pass proximately to a heat exchanger to heat the second of the two airflows, and the heat exchanger being positioned in the chassis. The first heated exhaust airflow and the second heated exhaust airflow are generated by dividing the first airflow after the first airflow has exchanged heat with the hardware component.

Modifying the rate of the first heated exhaust airflow and the rate of the second heated exhaust airflow based on the user input may include modifying a position of an airflow control component with respect to the first exhaust vent or the second exhaust vent. Modifying the position of the airflow control component may terminate the first heated exhaust airflow or the second heated exhaust airflow.

The position of the airflow control component may be modified by activating a motor coupled to the airflow control component. The airflow control component comprises a solid screen with holes corresponding to discrete ventilation slits of the first exhaust vent or the second exhaust vent.

The solid screen may seal the first exhaust vent or the second exhaust vent while the holes are not aligned with the discrete ventilation slits.

Modifying the position of the airflow control components may establish alignment or misalignment of the holes and the discrete ventilation slits. The first exhaust vent and the second exhaust vent may be coupled so that only the first heated exhaust airflow or the second heated exhaust airflow is exhausted from the data processing system at any time.

The ventilation control component may include a sliding control unit adapted to: slide between two positions, and move a first airflow control component with respect to the first exhaust vent and move a second airflow control component with respect to the second exhaust vent as the sliding control unit slides between the two positions to modify the rate of the first heated exhaust airflow and the rate of the second heated exhaust airflow based on the user input, the user input being the sliding of the of the sliding control unit between the two positions.

The chassis may also include a third exhaust vent adapted to direct a third heated exhaust airflow proximate to the interface surface.

The third exhaust vent is positioned between two user interface elements of the data processing system that are positioned on the interface surface. The third exhaust vent may be positioned on the interface surface, the second exhaust vent is positioned proximate to the first exhaust vent, and the third exhaust vent is positioned away from first exhaust vent.

The second exhaust vent may include reversibly sealable ventilation slits operable by the ventilation control component.

The first exhaust vent and the second exhaust vent may be mechanically coupled to proportionally increase a flow rate of the first heated exhaust airflow as a flow rate of the second heated exhaust airflow decreases. The first exhaust vent and the second exhaust vent may also be mechanically coupled to proportionally decrease the flow rate of the first heated exhaust airflow as the flow rate of the second heated exhaust airflow increases.

In an embodiment, a method is provided for managing airflow for the data processing system.

In an embodiment, a non-transitory media including computer instructions is provided. The computer instructions when executed by a processor may cause the method to be provided.

Turning to FIG. 1A, a diagram of data processing system 100 is shown. The data processing system may be implemented with a computing device such as a host or server, a personal computer (e.g., desktops, laptops, and tablets), a "thin" client, a personal digital assistant (PDA), a Web enabled appliance, or a mobile phone (e.g., Smartphone), and/or any other type of data processing device or system. For additional details regarding computing devices, refer to FIG. 4.

In FIG. 1A, the data processing system is illustrated as being a laptop computer (e.g., a top view with the laptop being open to expose a keyboard, trackpad, etc.). For conciseness, the laptop computer is illustrated without a display which may be attached, for example, to an upper portion near rear exhaust vent 112 illustrated in FIG. 1A via hinge or other type of mechanical linkage. However, data processing system 100 may be implemented with other types of computing devices without departing from embodiments disclosed herein.

Data processing system 100 may provide any quantity and type of computer implemented services. The computer implemented services may include, for example, database services, instant messaging services, video conferencing services, and/or any other types of services that may be provided by data processing systems.

To provide the computer implemented services, data processing system may include a screen (not shown) for displaying information to a user, a keyboard including any number of keys (e.g., 108) for allowing a user to input information, and input pad 106 to allow the user to indicate whether the user's interest with the display may be located. For example, a user may position their hands proximate to the keyboard and/or input pad 106 and use their fingers to depress keys, touch input pad 106, etc. The keyboard, input pad 106, and/or other types of user interface elements may be positioned on user interface surface 104. User interface surface 104 may, for example, be an interior surface covered by the display while the laptop is closed (e.g., in a clam-shell type of laptop) and the interior surface may be exposed when the laptop is open. When open, the display may be oriented for use by the users (e.g., perpendicular to user interface surface 104).

Data processing system 100 may also include various hardware components such as processors, memory modules, etc. (not shown) that contribute computing resources usable to provide the computer implemented services. These hardware components may consume electrical power to perform various types of operations that may contribute to performance of computations, and may generate heat as a byproduct of the performed operations.

The hardware components may be positioned in chassis 102 and may have a limited thermal operating range. For example, the hardware components may be rated to provide certain functions so long as the temperatures of the hardware components stay within a predefined range and may malfunction or otherwise operate in undesirable manners if the temperatures of the hardware components are outside of the predefined range. Different hardware components may have different predefined ranges. Consequently, heat generated by these hardware components may need to be removed for these components to stay within their limited thermal operating range to continue to operate nominally (e.g., as expected/rated to perform under certain conditions).

To remove heat from these components, various vents may be positioned on chassis 102 so that heat from the hardware components positioned therein may be removed. The vents may allow for intake and/or exhaustion of gasses which may be used to dissipate heat from the hardware components. For example, side exhaust vent 110 and rear exhaust vent 112 (both highlighted with dotted in-fill in FIG. 1A) may facilitate exhaustion of heated gasses from an interior of chassis 102. These vents (e.g., 110, 112) may be positioned on side and rear faces of chassis 102, and may direct the exhausted airflows away from user interface surface 104 and/or a person positioned to use data processing system 100. In contrast to other portions of chassis 102 which may generally limit intake/exhaustion of gasses, the vents may include, for example, openings in chassis 102, may include filters or screens (e.g., mechanical and/or electromagnetic interference screens).

Other vents (not shown) may facilitate intake of cool gasses to facilitate cooling of the hardware components. For example, an intake vent may be positioned on a bottom surface of chassis 102 to allow cool gasses to be brought into the interior of chassis 102. In this manner, an airflow path through the interior of chassis 102 may be established that is usable to cool hardware components within chassis 102.

Figure 1B:
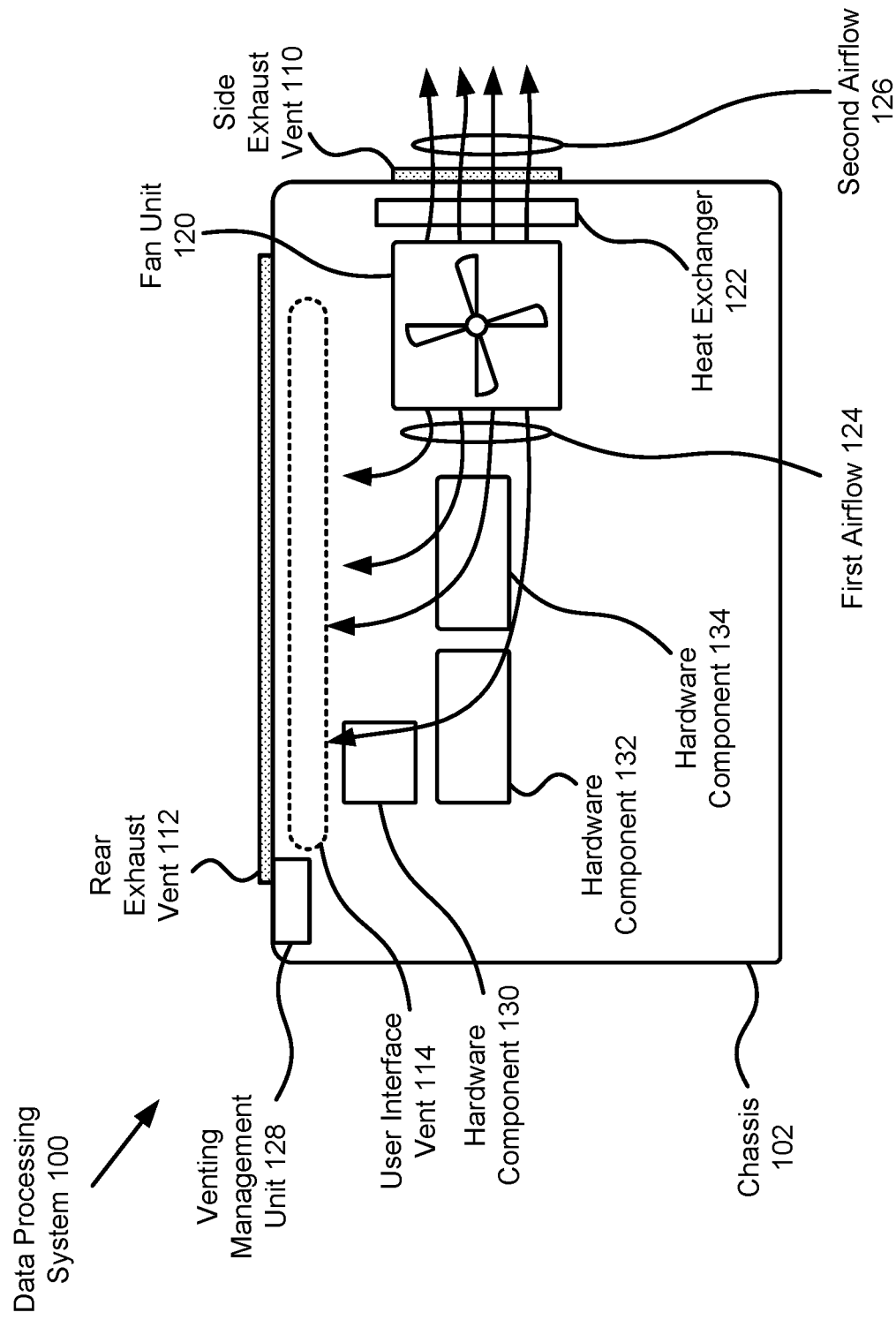
FIG. 1B shows a top view diagram illustrating an interior of a chassis of a data processing system in accordance with an embodiment.

In general, embodiments disclosed herein relate to methods, systems, and devices for improving the usability of data processing systems. To improve the usability of data processing systems, data processing system 100 may include one or more user interface vents (e.g., 114, highlighted in FIG. 1A with lined infill) for selectively directing an airflow proximate to a user's hands (or other portions of the user's body). For example, while a user provides input to data processing system 100 through a keyboard and/or input pad 106 of data processing system 100, user interface vent 114 may selectively direct an airflow proximate to the user's hands, fingers, etc. The airflow may be heated (e.g., via operation of components positioned within chassis 102) and thereby allow a user to warm the user's hands while operating data processing system 100. Refer to FIG. 1B for additional details regarding generation and flow of airflows through the interior of chassis 102.

Data processing system 100 may also include features that allow the user to select a strength of the airflow from user interface vent 114. For example, the user may be able to increase the rate of the airflow (up to a predetermined limit) to increase the rate at which the user's hands are warmed, or decrease the rate of the airflow or stop the airflow from user interface vent 114 entirely to decrease or eliminate heating of the user's hands by the data processing system.

To facilitate selective direction of heated airflows, data processing system 100 may collect heat generated by hardware components of data processing system 100, use the collected heat to heat an airflow, and direct the heated airflow (if so desired, and/or portions thereof) proximate to user interface surface 104. By doing so, heat that would otherwise be dissipated and/or not used for other purposes (e.g., and generated as a byproduct of providing other desired computer-implemented services) may be captured and used for productive purposes.

To maintain the temperatures of the hardware components, data processing system 100 may maintain rates of airflow through the interior of chassis 102 by linking the airflows exhausted out of rear exhaust vent 112 and user interface vents 114. For exampling, when a user desires a rate of a heated airflow exhausted out of user interface vent 114 to be increased or decreased, the rate of the airflow exhausted out of rear exhaust vent 112 may be increased or decreased in a complementary manner such that the total airflow exhaustion rate out of both vents is maintained.

In an embodiment, the airflow rates of airflows exhausted out of rear exhaust vent 112 and user interface vent 114 are inversely proportional to one another. The airflow rates may be maintained as inversely proportional to one another through linkage of airflow constraint mechanisms employed by these exhaust vents. Consequently, an actuation of the airflow constraint mechanism of user interface vent 114 that increases the airflow rate out of user interface vent 114 may automatically result in an actuation of the airflow constraint mechanism of rear exhaust vent 112 that decreases the airflow rate out of rear exhaust vent 112 proportionally to the increased flow rate out of user interface vent 114, and similarly for decreases in the airflow rate out of user interface vent 114.

Generally, user interface vent 114 may be implemented with one or more openings in chassis 102. Screens or other mechanical elements may span portions of the one or more openings to, for example, (i) reduce the likelihood of materials (e.g., dust) and/or objects (e.g., fingers, writing devices, etc.) entering the interior of chassis 102 via user interface vent 114, (ii) limit transmission of electromagnetic waves into and/or out of the interior of chassis 102, and/or to perform other functions usable to separate the interior environment of chassis 102 from the ambient environment. User interface vent 114 may include other features without departing from embodiments disclosed herein. Additionally, a data processing system may include any number of user interface vents without departing from embodiments disclosed herein. Refer to FIGS. 1C-1F for additional details regarding user interface vents.

To manage the flow of airflows out of user interface vent 114 and/or other vents, one or more user interface elements (not shown) may be positioned on user interface surface 104 and/or other locations on chassis 102 (e.g., on a rear surface on which rear exhaust vent 112 may be positioned). The user interface elements may be implemented using, for example, switches, toggles, sliders, and/or other structure which a user may interact with while using data processing system 100. The user interface elements may be coupled to actuation mechanisms that may constrict or enhance the flow of gasses through user interface vent 114 and/or other vents. Refer to FIGS. 1C-1D and 2A-2B for additional details regarding user interface elements, actuation mechanisms, and/or airflow constriction mechanisms (e.g., solid screen with holes 180, discussed with respect to FIGS. 2A-2B below).

While illustrated in FIG. 1A with a limited number of specific components, a data processing system may include additional, fewer, and/or different components without departing from embodiments disclosed herein.

Turing to FIG. 1B, a diagram of an interior of data processing system 100 in accordance with an embodiment is shown. The view presented in FIG. 1B may represent a top view of the data processing system similar to that shown in FIG. 1A, with surface interface surface 104, and components positioned thereon removed. A select number of components that may be present within the interior of chassis 102 are showed for conciseness, but it should be understood that different, fewer, and/or additional components may be positioned in chassis 102 than those illustrated in FIG. 1B without departing from embodiments disclosed herein.

As discussed above, data processing system 100 may establish airflows through the interior of chassis 102 to dissipate heat generated by various hardware components (e.g., 130-134) positioned in chassis 102. Any of the hardware components may generate similar or different amounts of heat and may need different rates of airflow proximate to the respective hardware component to maintain its temperature within its operational temperature range.

To establish the airflows, data processing system 100 may include fan unit 120. Fan unit 120 may include a fan (or other type of airflow generation component), a housing or other structure (e.g., to direct generated airflows), and/or mechanical features usable to generate and/or direct airflows.

In an embodiment, fan unit 120 is adapted to draw gasses in from a bottom side of chassis 102 (e.g., through a vent positioned on an underside of chassis 102) and exhaust the gasses out of at least two sides of fan unit 120 to generate first airflow 124, second airflow 126, and/or any number of other airflows not illustrated in FIG. 1B. For example, a housing for the fan may include three openings, one for intake of gasses and two for exhausting of gasses to establish two airflows. While shown in FIG. 1B as being unitary, fan unit 120 may be implemented as a distributed structure and may include any number of fans and housings which may be positioned in different or similar locations from that shown in FIG. 1B without departing from embodiments disclosed herein.

First airflow 124 may be directed to pass proximate to hardware components 132-136 (e.g., processors, memory modules, storage devices, combinations thereof and/or other types of hardware devices, etc.). For example, first airflow 124 may be directed to a center of the interior of chassis 102. Chassis 102 may include other mechanical features (e.g., baffling walls, etc. not shown) to route first airflow 124 by hardware components 130-134 and to user interface vent 114 (drawn with dashed outline in FIG. 1B to indicate that it may be on use interface surface 104 not shown in FIG. 1B) and rear exhaust vent 112. First airflow 124 may be exhausted out of interior of chassis 102 via user interface vent 114 and/or rear exhaust vent 112 depending on a level of airflow constriction of these vents. Thus, through construction of rear exhaust vent 112, first airflow 124 (after being heated through thermal exchange with hardware components 132-136) may be substantially entirely exhausted out of user interface vent 114. Likewise, first airflow 124 may be substantially entirely exhausted out of rear exhaust vent 112 through construction of user interface vent 114 and dilation of rear exhaust vent 112.

For example, to constrict rear exhaust vent 112 and/or user interface vent 114, corresponding constrictions mechanisms may be placed with these vents. The constrictions mechanisms may be actuated to constrict or dilate the respective vents. The construction mechanisms may be actuated by, for example, venting management unit 128.

Venting management unit 128 may be implemented with active and/or passive components. These components may be mechanically coupled to user operable components (e.g., ventilation control component 150, discussed with respect to FIG. 1C below) to facilitate user controlled actuation of constriction mechanisms that may constrict or dilate rear exhaust vent 112 and/or user interface vent 114 (and/or other construction mechanisms associated with other vents).

In an embodiment, venting management unit 128 is implemented with one or more active components including one or more electric motors coupled to the constriction mechanisms. Operation of the electric motors may actuate the corresponding constriction mechanisms to constrict or dilate the vents thereby increasing or decreasing impedance to flows of gasses through these respective vents. The electric motors may be selectively powered based on operation of the operable components used by the user of data processing system 100 so that the user may manage the flow of gasses out of rear exhaust vent 112 and/or user interface vent 114.

In an embodiment, venting management unit 128 is implemented with one or more passive components including one or more mechanical linkages coupled to the construction mechanisms. The mechanical linkages may transmit forces applied by a user of data processing system 100 to the operable components usable by the user to manage the flow of gasses out of rear exhaust vent 112 and/or user interface vent 114. For example, the mechanical linkages may be implemented with bars, gears, and/or other structures usable to transmit force. The transmitted force may actuate the construction mechanisms thereby allowing the user of data processing system 100 to manage the flow of gasses out of rear exhaust vent 112 and/or user interface vent 114.

Figure 1C:
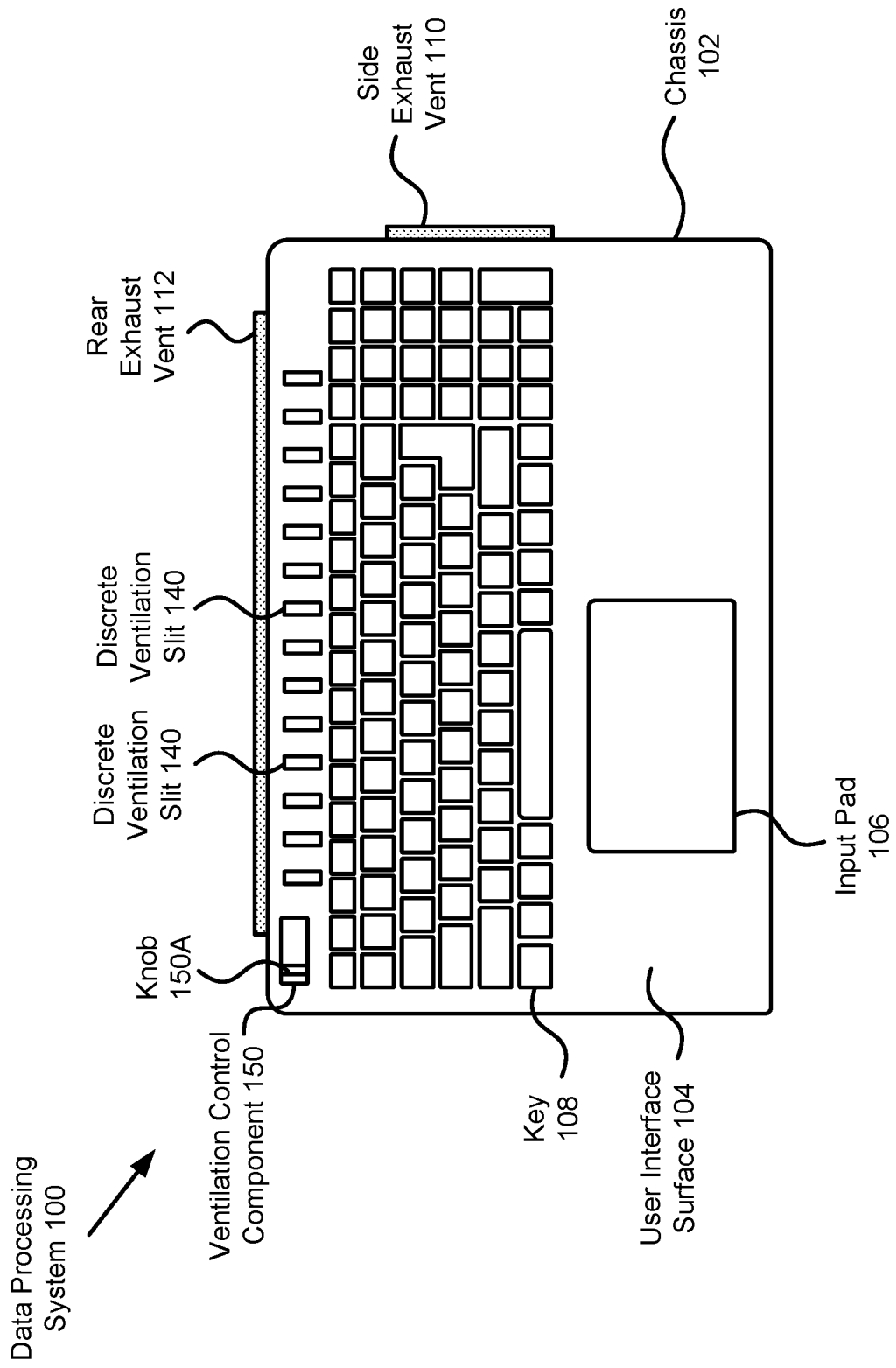
FIG. 1C shows a top view diagram illustrating a data processing system with dilated discrete ventilation slits in accordance with an embodiment.

Turning to FIG. 1C, a top view diagram of data processing system 100 in accordance with an embodiment is shown. The top view may be similar to that illustrated in FIG. 1A.

In an embodiment, a user interface vent of data processing system 100 is include a number of discrete ventilations slits (e.g., 140) in chassis 102. The discrete ventilation slits may be openings in chassis 102. The user interface vent may be implemented using any number of discrete ventilation slits to facilitate airflow proximate to user interface surface 104.

To manage a rate of airflow out of the user interface vent and/or rear exhaust vent 112, ventilation control components 150 may be positioned on user interface surface 104 (and/or other surface accessible to a user of data processing system 100). Ventilation control component 150 may be actuated by the user of data processing system 100. Actuation of ventilation control component 150 may modify the rates of airflow out of rear exhaust vent 112 and/or the user interface vent. For example, ventilation control component 150 may be coupled (e.g., mechanically) to venting management unit 128 which may translate the actuation of ventilation control component 150 to changes in the airflow rates through one or more of these vents.

In an embodiment, ventilation control component 150 is implemented with a slider control that may move between various positions. These positions may be associated with different rates of airflow out of rear exhaust vent 112 and/or the user interface vent. Consequently, movement of the slider control (or portions thereof) to the corresponding positions may allow the user to selectively increase or decrease airflows out of various vents positioned on chassis 102.

For example, consider a scenario where the slider control includes knob 150A that may be moved between two positions along a track. When in a first position as illustrated in FIG. 1C, discrete ventilation slits (e.g., 140) may be dilated and facilitate airflow through the discrete ventilation slits. In this scenario, the first airflow may only be exhausted out of the discrete ventilation slits to establish an airflow proximate to the keyboard, input pad 106, and/or other surfaces where a user's body (e.g., hands) may be present thereby facilitating warming of the user.

Figure 1D:
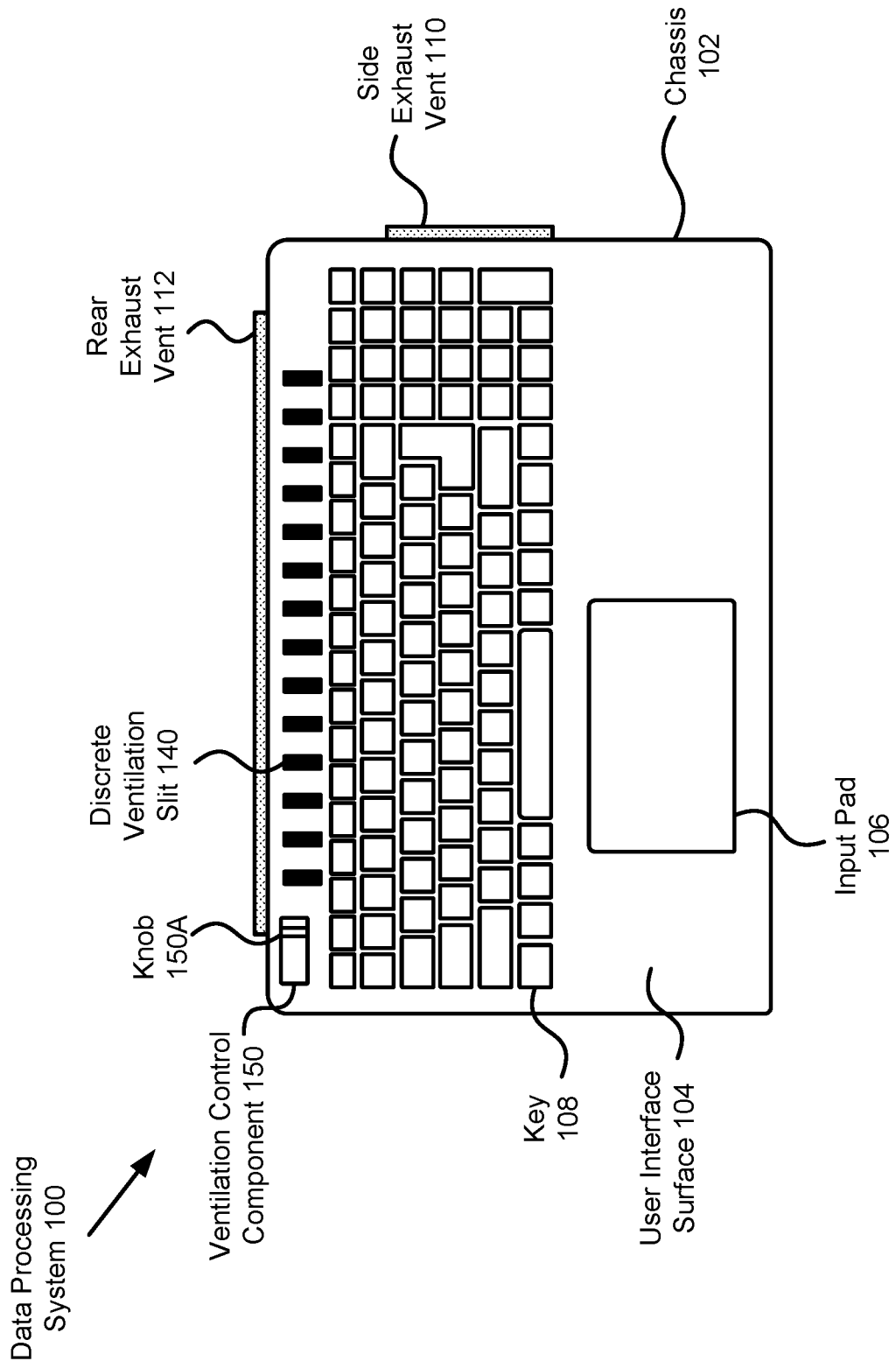
FIG. 1D shows a top view diagram illustrating a data processing system with constricted discrete ventilation slits in accordance with an embodiment.

Now, consider a scenario in which the knob is moved to a second position as illustrated in FIG. 1D. Turning to FIG. 1D, a top view diagram of data processing system 100 in accordance with an embodiment is shown. The top view may be similar to that illustrated in FIG. 1C.

As seen in FIG. 1D, a user may have actuated ventilation control component 150 by moving a knob to the second position (e.g., to the right of the first position). Actuation of the knob may entirely constrict discrete ventilation slits 140 (e.g., illustrated in FIG. 1D by being filled with solid black color).

In this state, all of the first airflow may be exhausted out of rear exhaust vent 112. A user may elect to place data processing system 100 in this this state so that heated gasses from the interior of chassis 102 do not pass proximately to the user's body. For example, the user may be operating data processing system 100 in a hot environment and may not desire to have heated gasses pass near them.

However, if the user desires to have heated gasses pass by their body, the user interface vent may include various features to assist in the direction of the heated gasses toward the user's body.

Figure 1E:
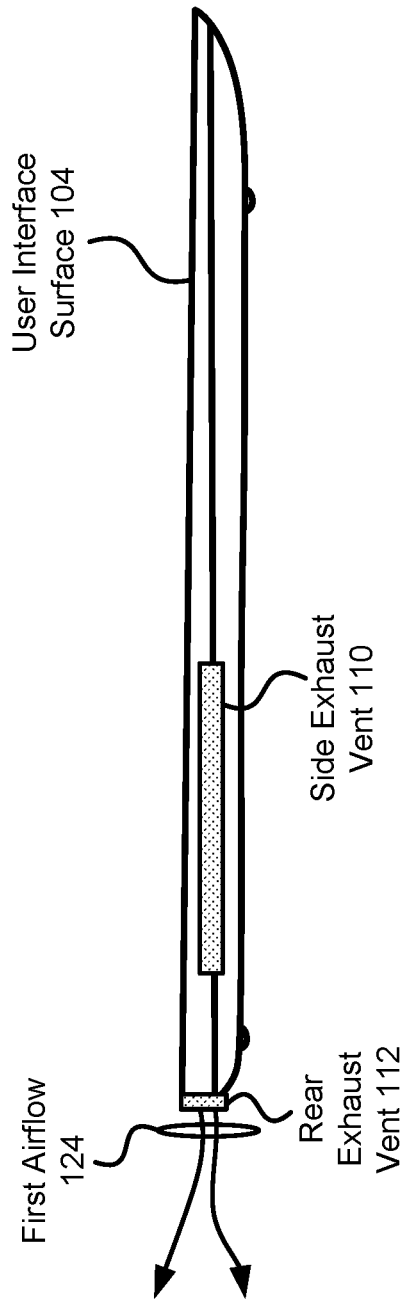
FIGS. 1E-1F show side view diagrams illustrating a data processing system in accordance with an embodiment.
Figure 1F:
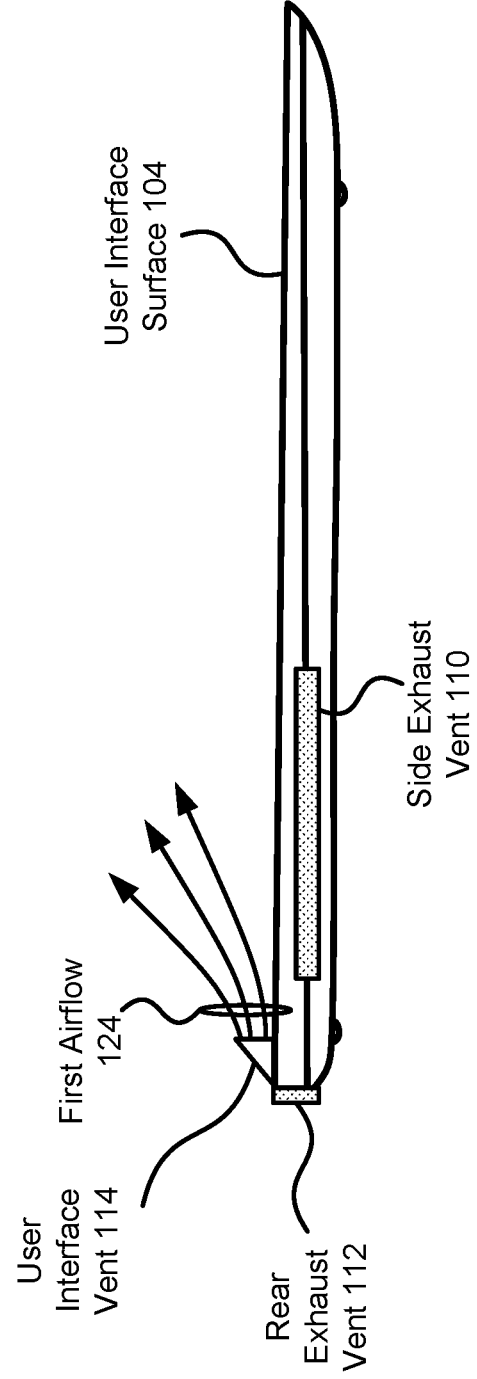

Turning to FIGS. 1E-1F, side view diagrams of data processing system 100 in accordance with an embodiment is shown. In FIG. 1E, data processing system 100 is shown in a state in which first airflow 124 is exhausted out of rear exhaust vent 112.

However, if the user desires to have warmed gasses pass proximate to their body, the user may actuate the ventilation control component 150 to modify exhaustion of first airflow 124.

For example, turning to FIG. 1F, once ventilation control component 150 is actuated to another position, user interface vent 114 may be dilated and/or may including ducting (or other mechanical features such as flanges, walls, etc.) that may rise above user interface surface 104 to constrain a direction of the flow of first airflow 124 out of user interface vent 114. The ducting preferentially direct first airflow 124 along user interface surface 104 and/or toward the user operating data processing system 100. In some embodiments, the raised ducting may stay in a raised position regardless of the position of ventilation control component 150. For example, ventilation control component 150 may only dilate or constrain user interface vent 114.

Figure 1G:
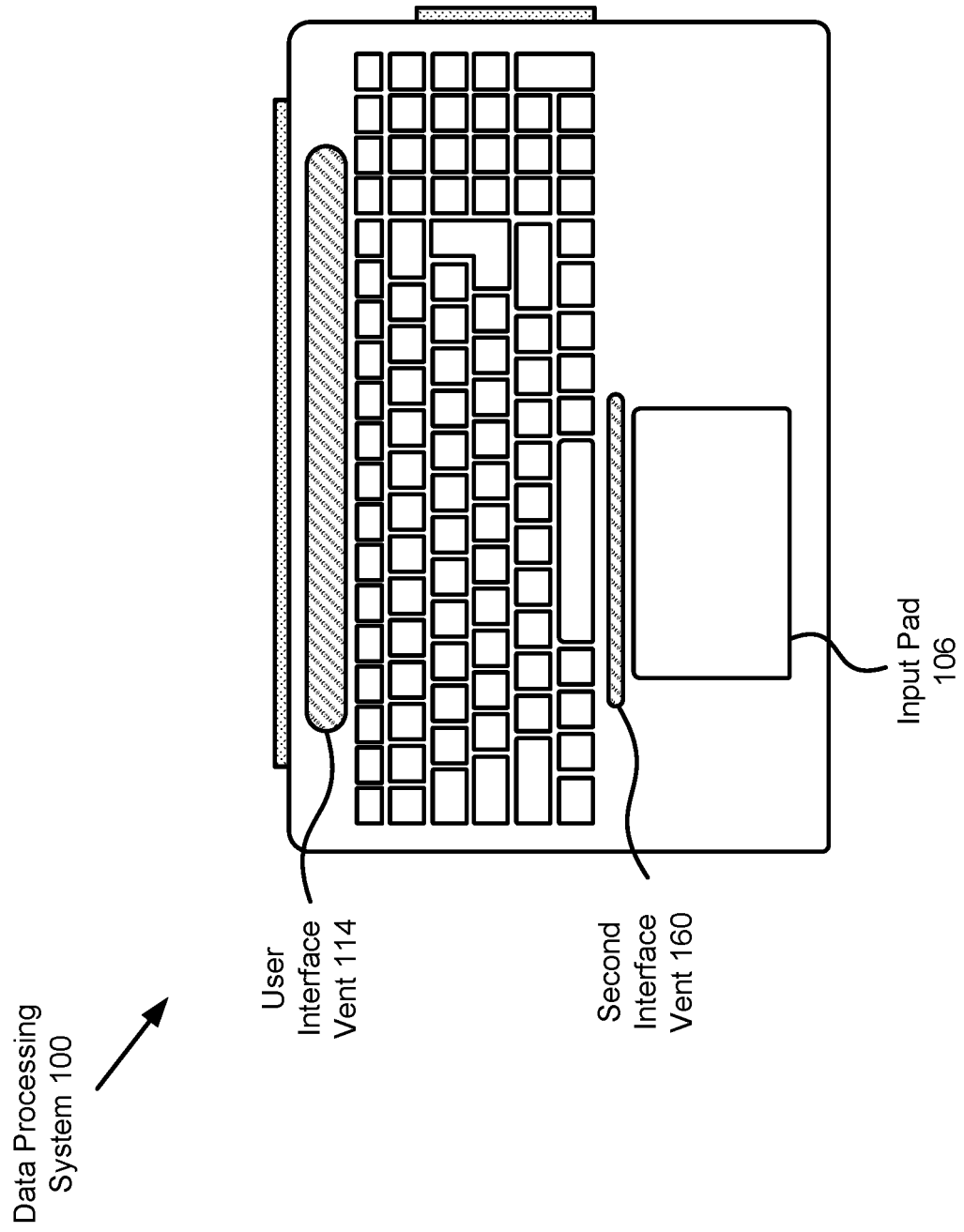
FIGS. 1G-1H show top view diagrams illustrating a data processing system with second interface vents in accordance with an embodiment.
Figure 1H:
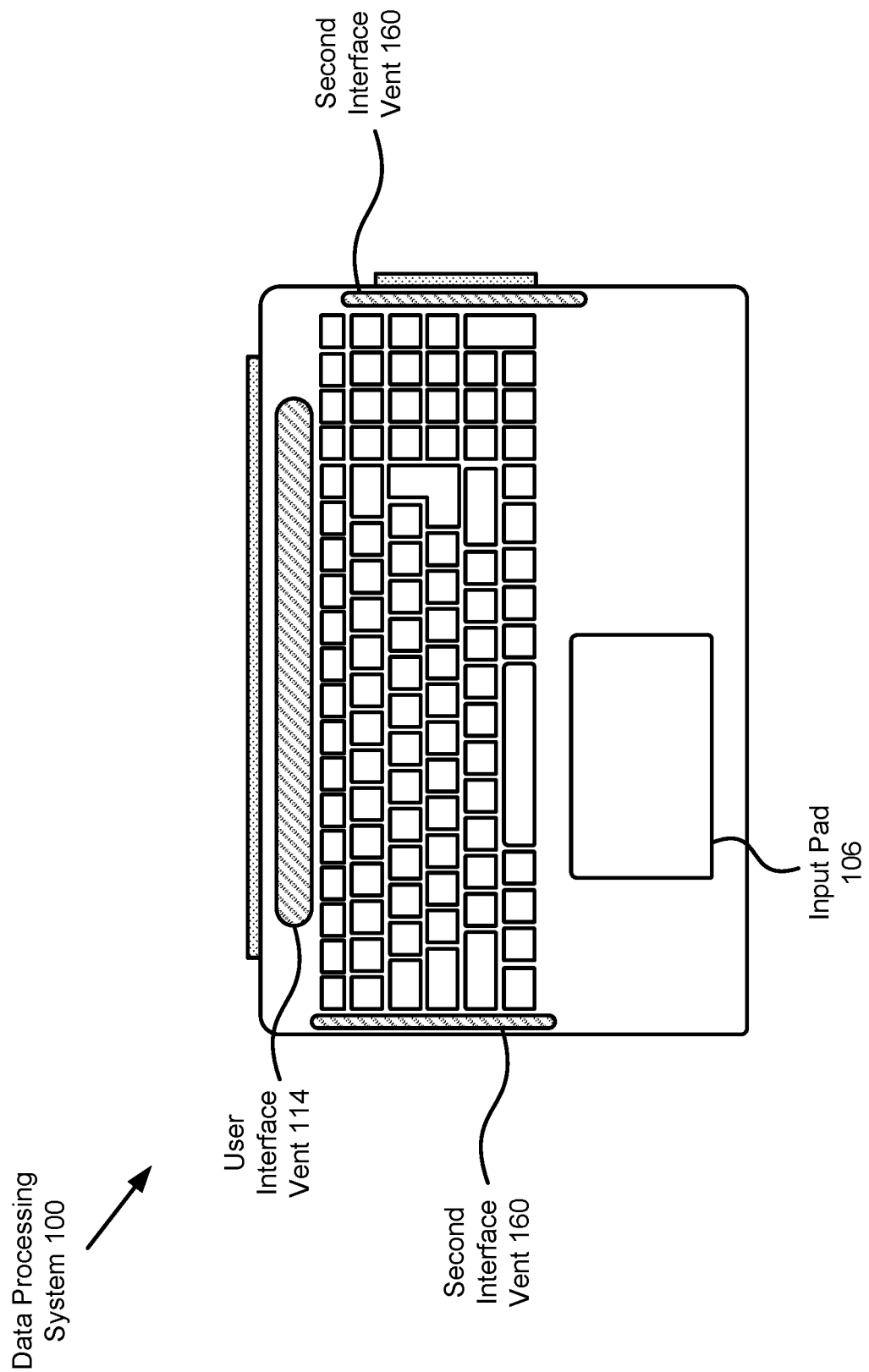

While illustrated in FIGS. 1A-1F with respect to inclusion of a single user interface vent, a data processing system may include multiple user interface vents without departing from embodiments disclosed herein. Turning to FIGS. 1G-1H, top view diagrams of data processing system 100 in accordance with an embodiments disclosed herein are shown.

As seen in these figures, data processing system 100 may include one or more of second interface vent 160. These second interface vents may be similar to user interface vent 114, but may be placed in other locations. For example, a second interface vent may be positioned between a keyboard and input pad 106. In another example, second interface vents may be placed along portions of the border around the keyboard.

Like user interface vent 114, second interface vent 160 may include or be associated with a constriction mechanism to manage airflows out of various vents in data processing system 100.

While shown in FIGS. 1G-1H as including both user interface vent 114 and at least one second interface vent 160, a data processing system may include a second interface vent and may not include user interface vent 114 without departing from embodiments disclosed herein.

Figure 2A:
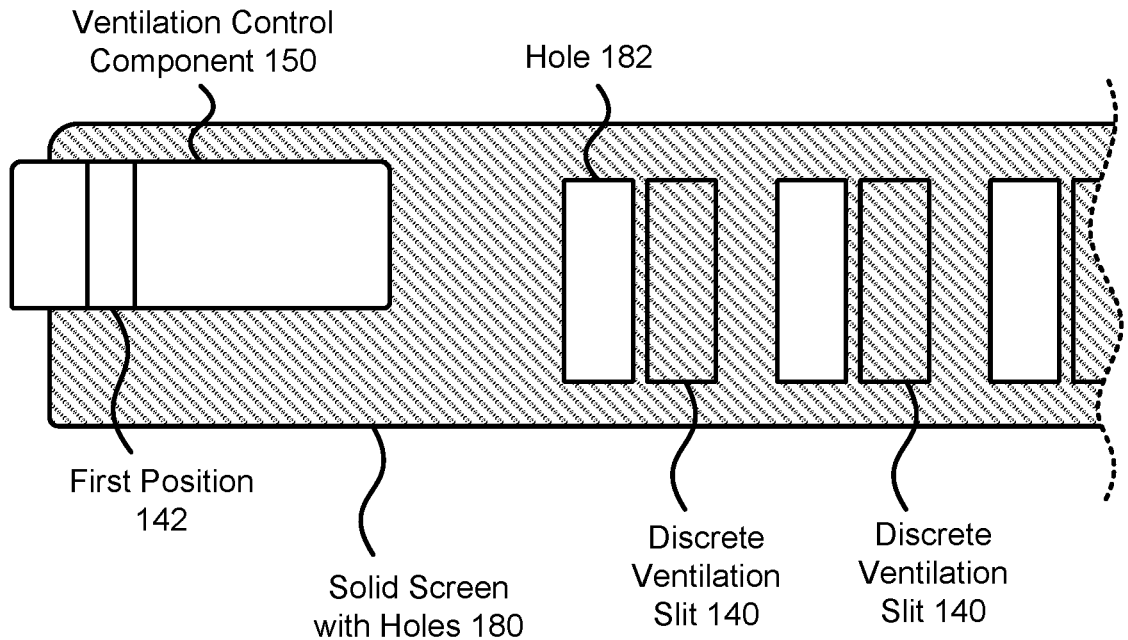
FIGS. 2A-2B show diagrams illustrating constriction mechanisms of data processing systems in accordance with an embodiment.
Figure 2B:
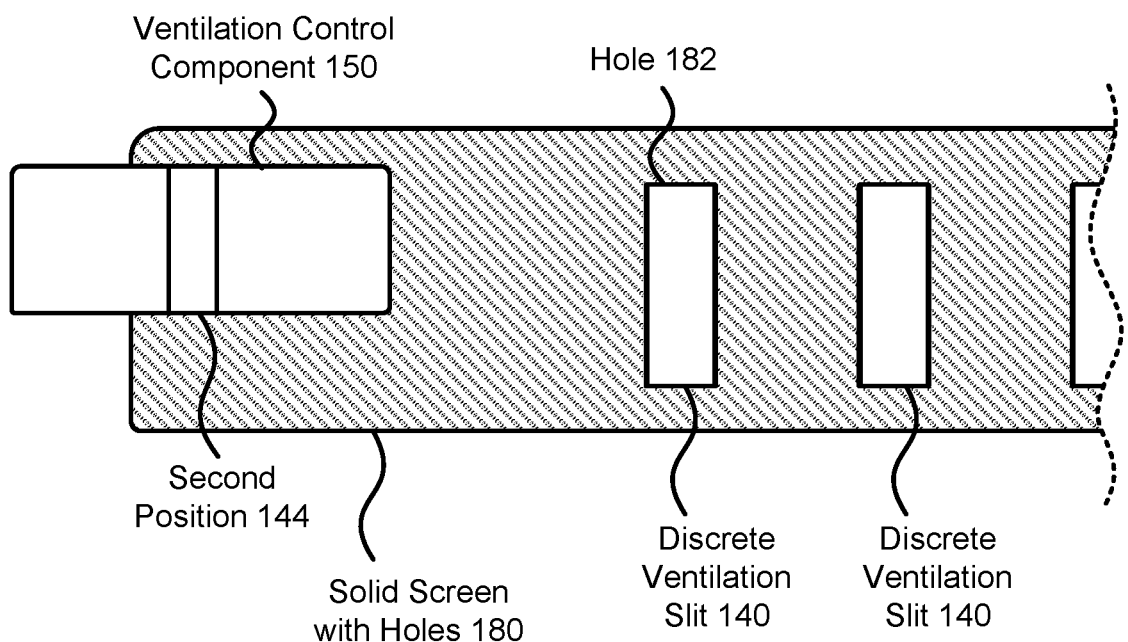

As discussed above, any of the vents in chassis 102 of data processing system 100 may include constraint mechanisms. FIGS. 2A-2B show diagrams of a constraint mechanism in accordance with embodiments disclosed herein. Specifically, FIG. 2A shows a diagram of the constraint mechanism in a configuration that constrains a vent (in these example figures, shown with respect to discrete ventilation slit 140 but may be applied to other types of vent topologies), and FIG. 2B shows a diagram of the constraint mechanism in a second configuration that dilates the vent to facilitate airflow through the vent.

Turning to FIG. 2A, the constraint mechanism may include slide screen with holes 180 (illustrated lined infill in FIGS. 2A-2B). Solid screen with holes may include a sheet of solid material with holes (e.g., 182) in it. The holes may correspond to discrete ventilation slits (e.g., 140). When the holes are aligned with the discrete ventilations slits (e.g., as illustrated in FIG. 2B), then solid screen with holes 180 may not restrict airflow through the discrete ventilation slits. In contrast, when the holes in the solid screen are not aligned with the discrete ventilation slits, then solid screen with holes may restrict (partially or entirely) airflow through the discrete ventilation slits.

To facilitate reversible alignment of the holes and discrete ventilation slit, solid screen with holes 180 may be directly or indirectly coupled to ventilation control component 150. When a knob of ventilation control component 150 is in first position 142, the holes may not be aligned with the discrete ventilation slits thereby constricting airflow through the discrete ventilation slits. In contrast, when the knob of ventilation control component 150 is in a second position 144 as shown in FIG. 2B, the holes may be aligned with the discrete ventilation slits thereby not constricting airflow through the discrete ventilation slits. As user may modify the position of the knob through application of force, thereby allowing the user to control airflow through the vent.

Figure 3:
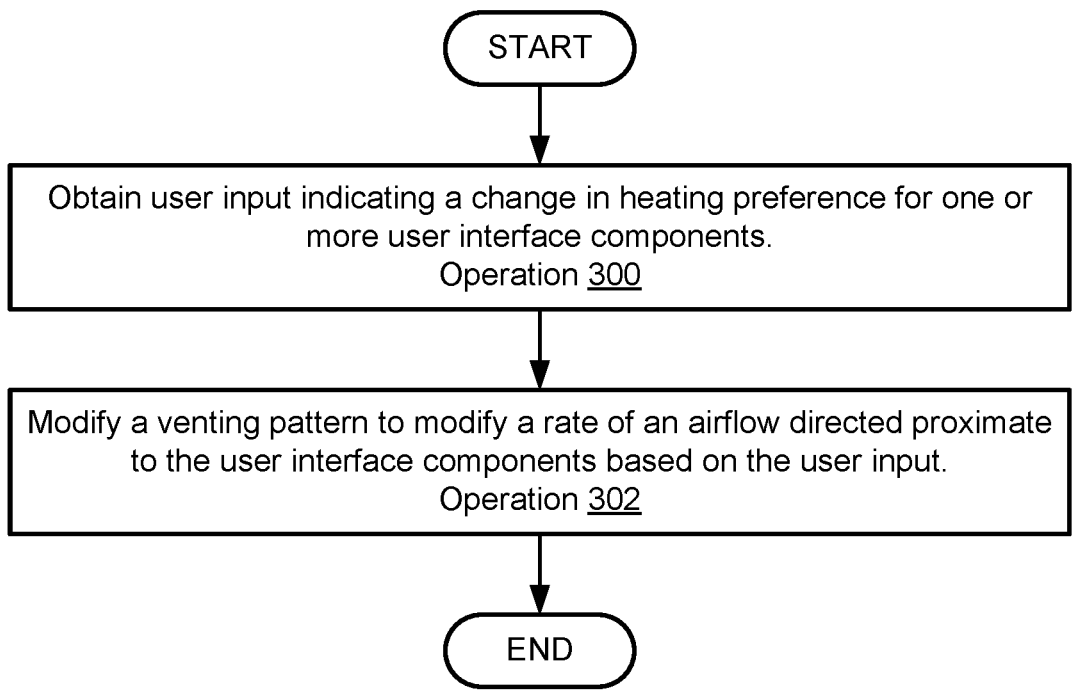
FIG. 3 shows a diagram illustrating a flowchart of a method of directing airflow in accordance with an embodiment.

As discussed above, the components of FIGS. 1A-2B may perform various methods to manage a data processing system. FIG. 3 illustrate a method that may be performed by the components of FIG. 1A. In the diagram discussed below and shown in FIG. 3, any of the operations may be repeated, performed in different orders, and/or performed in parallel with or in a partially overlapping in time manner with other operations.

Turning to FIG. 3A, a flow diagram illustrating a method of managing exhaust airflows of a data processing system in accordance with an embodiment is shown.

At operation 300, user input indicating a change in heating preference for one or more user interface components is obtained. The user input may be obtained by receiving it from the user, reading it from storage, and/or receiving it from another device. The user input by may be received by the user via (i) a ventilation control component (e.g., button, slider, etc.), (ii) a key of a keyboard, (iii) an input pad, and/or (iv) other element of a data processing system.

For user input received via the keyboard or other element managed by an operating system or other type of management entity of the data processing system, and agent (e.g., executing computer program) or other entity hosted by the hardware components of the data processing system may provide the user input to a venting management unit. By doing so, a user may provide the user feedback through a graphic user interface and/or in conjunction with a display of the data processing system.

At operation 302, a venting pattern is modified to modify a rate of airflow directed proximate to the user interface components based on the user input. The venting pattern maybe modified by actuating constriction mechanisms for vents through which the airflow and/or other airflows traverse based on the user input. For example, the user input may indicate an increase or decrease in the rate of the airflow or an actuation of the constriction mechanisms.

The constriction mechanisms may be actuated, as noted above, through active or passive approaches. For example, the active approach may include applying electrical power to an electric motor coupled to one or more constriction mechanisms. The electrical power may cause the electric motor to actuate the one or more constriction mechanisms thereby constricting and/or dilating corresponding vents.

To implement the active approach, the hardware components of the data processing system may be operably connected to a venting management unit, which may be implemented using (i) a separate programmable computing device (e.g., a programmable device such as a microcontroller) or special purpose computing devices (e.g., an application specific integrated circuit) or (ii) a portion of the hardware components of the data processing system.

The method may end following operation 302.

Using the method illustrated in FIG. 3, embodiments disclosed herein may provide a system capable of selectively modulating rates of heated airflows passing proximate to where a person's hands may be positioned when using a data processing system. By doing so, a user's hand temperature may be retained within desired ranges (or may be heated in a desired manner) while the user uses the data processing system.

Figure 4:
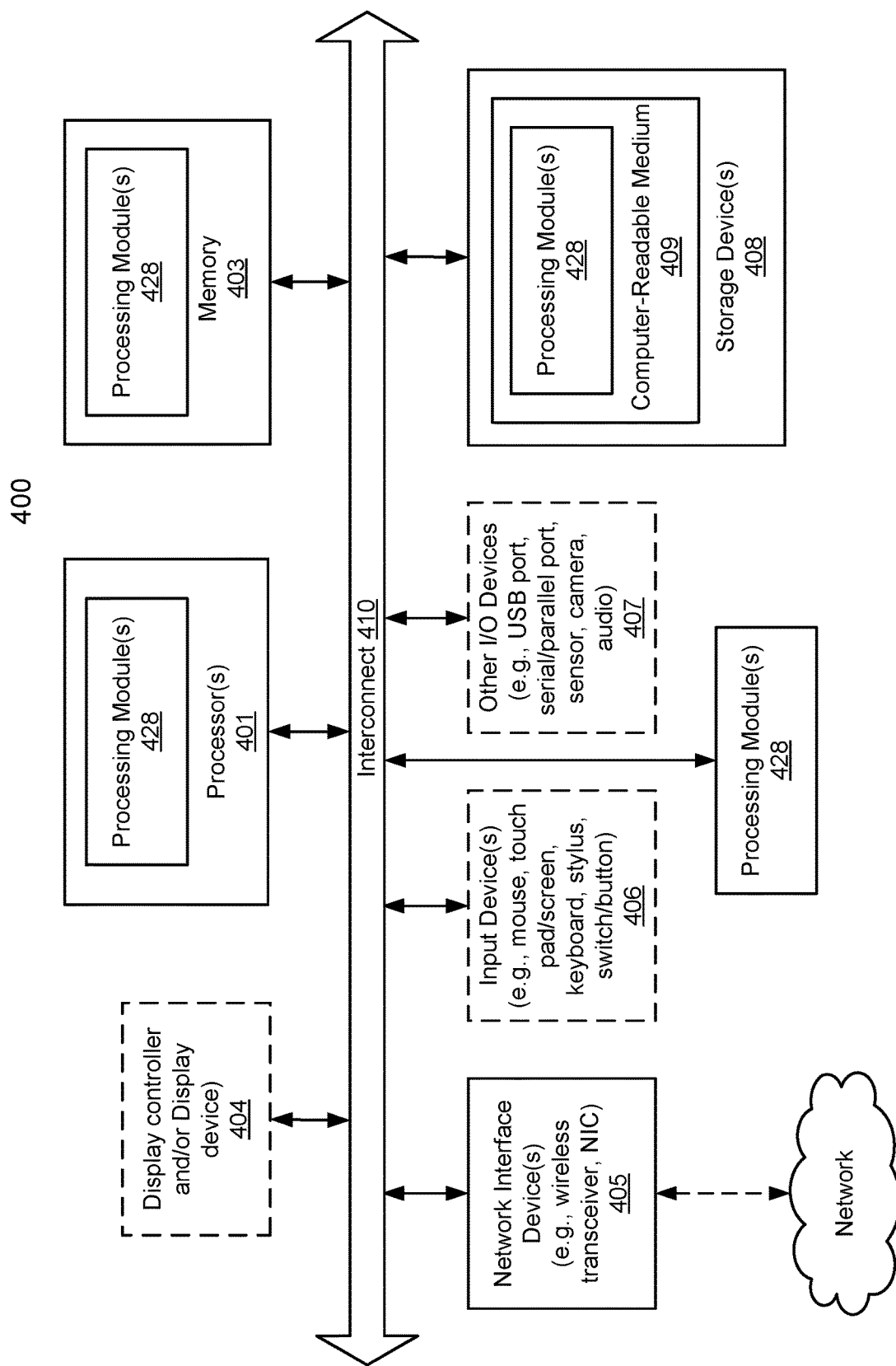
FIG. 4 shows a block diagram illustrating a computing device in accordance with an embodiment.

As discussed above, a data processing system may be implemented with one or more computing devices. Turning to FIG. 4, a block diagram illustrating an example of a computing device in accordance with an embodiment is shown. For example, system 400 may represent any of the data processing systems and/or computing devices described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-408 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft °, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system for providing computer implemented services to a user, the data processing system comprising:
   a chassis comprising:
      an interface surface, a first exhaust vent adapted to direct a first heated exhaust airflow away from the interface surface, and a second exhaust vent adapted to direct a second heated exhaust airflow proximate to the interface surface; and a user interface element positioned on the interface surface to initiate heat transfer between the second heated exhaust airflow and a hand of the user while the user uses the user interface element;

a ventilation control component adapted to:
receive user input; and
modify a rate of the first heated exhaust airflow and a rate of the second heated exhaust airflow based on the user input.

2. The data processing system of claim 1, further comprising:
a hardware component positioned within the chassis and adapted to:
heat the first heated exhaust airflow and the second heated exhaust airflow, and
perform a computation used to provide a portion of computer implemented services.

3. The data processing system of claim 2, further comprising:
fan unit positioned in the chassis and adapted to generate two airflows using an intake airflow from an underside of the chassis, and a first of the two airflows being directed toward the hardware component.

4. The data processing system of claim 3, wherein the chassis further comprises:
a third exhaust vent adapted to direct a third heated exhaust airflow away from the interface surface.

5. The data processing system of claim 4, wherein the third heated exhaust airflow is generated by passing a second of the two airflows to pass proximately to a heat exchanger to heat the second of the two airflows, and the heat exchanger being positioned in the chassis.

6. The data processing system of claim 4, wherein the first heated exhaust airflow and the second heated exhaust airflow are generated by dividing the first airflow after the first airflow has exchanged heat with the hardware component.

7. The data processing system of claim 1, wherein modifying the rate of the first heated exhaust airflow and the rate of the second heated exhaust airflow based on the user input comprises:
modifying a position of an airflow control component with respect to the first exhaust vent or the second exhaust vent.

8. The data processing system of claim 7, wherein modifying the position of the airflow control component terminates the first heated exhaust airflow or the second heated exhaust airflow.

9. The data processing system of claim 7, wherein the position of the airflow control component is modified by activating a motor coupled to the airflow control component.

10. The data processing system of claim 9, wherein the airflow control component comprises a solid screen with holes corresponding to discrete ventilation slits of the first exhaust vent or the second exhaust vent.

11. The data processing system of claim 10, wherein the solid screen seals the first exhaust vent or the second exhaust vent while the holes are not aligned with the discrete ventilation slits.

12. The data processing system of claim 11, wherein modifying the position of the airflow control components establishes alignment or misalignment of the holes and the discrete ventilation slits.

13. The data processing system of claim 1, wherein first exhaust vent and the second exhaust vent are coupled so that only the first heated exhaust airflow or the second heated exhaust airflow is exhausted from the data processing system at any time.

14. The data processing system of claim 1, wherein the ventilation control component comprises:
a sliding control unit adapted to:
slide between two positions, and
move a first airflow control component with respect to the first exhaust vent and move a second airflow control component with respect to the second exhaust vent as the sliding control unit slides between the two positions to modify the rate of the first heated exhaust airflow and the rate of the second heated exhaust airflow based on the user input, the user input being the sliding of the of the sliding control unit between the two positions.

15. The data processing system of claim 1, wherein the chassis further comprises:
a third exhaust vent adapted to direct a third heated exhaust airflow proximate to the interface surface.

16. The data processing system of claim 15, wherein the third exhaust vent is positioned between two user interface elements of the data processing system that are positioned on the interface surface.

17. The data processing system of claim 15, wherein the third exhaust vent is positioned on the interface surface, the second exhaust vent is positioned proximate to the first exhaust vent, and the third exhaust vent is positioned away from first exhaust vent.

18. The data processing system of claim 1, wherein the second exhaust vent comprises reversibly sealable ventilation slits operable by the ventilation control component.

19. The data processing system of claim 18, wherein the first exhaust vent and the second exhaust vent are mechanically coupled to proportionally increase a flow rate of the first heated exhaust airflow as a flow rate of the second heated exhaust airflow decreases.

20. The data processing system of claim 19, wherein the first exhaust vent and the second exhaust vent are also mechanically coupled to proportionally decrease the flow rate of the first heated exhaust airflow as the flow rate of the second heated exhaust airflow increases.

* * * * *